(12) United States Patent
Iwazaki

(10) Patent No.: US 6,466,594 B1
(45) Date of Patent: Oct. 15, 2002

(54) LASER MODULATING DEVICE

(75) Inventor: Shoji Iwazaki, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 122 days.

(21) Appl. No.: 09/669,766

(22) Filed: Sep. 26, 2000

(30) Foreign Application Priority Data

Sep. 27, 1999 (JP) ............................................ 11-272736

(51) Int. Cl.⁷ ................................................. H01S 3/13
(52) U.S. Cl. ...................... 372/29.01; 372/30; 372/38; 347/246
(58) Field of Search .............................. 347/246, 29.01, 347/30, 29.02, 38

(56) References Cited

U.S. PATENT DOCUMENTS

| 5,418,806 A | 5/1995 | Araki |
| 5,473,153 A | 12/1995 | Araki et al. |
| 5,832,012 A | 11/1998 | Araki et al. |
| 5,859,659 A | * 1/1999 | Araki et al. ................. 347/246 |
| 5,973,719 A | 10/1999 | Araki et al. |

* cited by examiner

Primary Examiner—Paul Ip
Assistant Examiner—Leith Al-Nazer
(74) Attorney, Agent, or Firm—Greenblum & Bernstein, P.L.C.

(57) ABSTRACT

A laser modulating device is provided with a monitoring system that outputs a detection voltage signal corresponding to the output power, a minimum output level setting system that outputs a minimum level voltage signal, a modulating voltage signal generating system, a first adder that outputs a reference voltage signal corresponding to a sum of the minimum level voltage signal and the modulating voltage signal, a comparing system that outputs a driving voltage signal corresponding to a difference between the reference voltage signal and the detection voltage signal, a first V/I converting system that converts the driving voltage signal to a first driving current, the first driving current being supplied to the laser diode, a second V/I converting system, and a circuit that directly supplies the modulating voltage signal from the modulating voltage signal generating system to the second voltage to current converting system, the second voltage to current converting system converting the modulating voltage signal into a second driving signal, the second driving signal being supplied to the laser diode.

10 Claims, 5 Drawing Sheets

LASER MODULATING DEVICE

BACKGROUND OF THE INVENTION

The present invention relates to a laser modulating device employed in, for example, a laser scanning device, and particularly to a laser modulating device equipped with for modulating the output power of the laser the laser diode.

In a laser scanning device having a laser diode as a light source, a laser modulating device is generally provided. The laser modulating device modulates the output power of the laser diode while the emitted beam is deflected to scan on a photoconductive surface. An image having a black density distribution corresponding to modulated level of the intensity of the laser beam is formed on the photoconductive surface.

In such a device, electrical currents corresponding to a minimum black density level, i.e., the white level and a maximum black density level are firstly determined. Then, the laser diode is driven such that an electrical current whose level is between the above-described white level and black level currents is supplied. In order to compensate for the intensity of the emitted beam due to individual characteristic errors of laser diodes and/or change of ambient temperature, part of light emitted by the laser diode is monitored, and a feed-back control which is known as an APC (automatic power control) is executed.

FIG. 6 shows a block diagram of an example of a conventional modulating circuit employing the APC system. A D/A (digital to analog) converter 21 outputs a data voltage Vdata corresponding to an input data signal Sdata representative of black density level of an image. The Sdata is generated based on the maximum level voltage Vmax corresponding to maximum output power Pmax of a laser diode LD, which is transmitted from a maximum level setting circuit 22.

The data voltage Vdata is added to a minimum level voltage Vmin by an adder 24. The minimum level voltage Vmin is a voltage for setting the minimum output power Pmin of the laser diode LD, which is transmitted from a minimum level setting circuit 23. With this structure, the adder 24 outputs a reference voltage Vref which is a sum of the minimum level voltage Vmin and the data voltage Vdata. The reference voltage Vref is input to an input terminal of a differential amplifier 25, and is compared with the monitor voltage Vmon, which is input to the other input terminal of the differential amplifier 25. The differential amplifier outputs a voltage Vdef, which is an amplified voltage of a difference between the monitor voltage Vmon and the reference voltage Vref. The voltage Vdef is converted into an electrical current corresponding thereto by a V/I (voltage to current) conversion circuit 26. The electrical current is supplied to the laser diode LD as a driving current Id. The laser beam emitted by the laser diode LD is received by a photo diode PD for monitoring, which receives part of the laser beam (generally a beam backwardly emitted by the laser diode LD) and outputs a monitoring current Imon. The monitoring current Imon is converted into the monitor voltage Vmon by an I/V (current to voltage) conversion circuit 27.

In this modulating device, depending on a data value of the data signal Sdata, the data voltage Vdata output by the D/A conversion circuit 21 varies. Therefore, the reference voltage Vref varies in accordance with the data signal Sdata since the reference voltage Vref is generated based on the data voltage Vdata. If the intensity of the light beam emitted by the laser diode LD is smaller than the intensity corresponding to the value of the data signal Sdata, the monitoring current Imon is relatively small, and therefore, the voltage Vmon output by the I/V conversion circuit 27 is small. In this case, the differential amplifier 25 outputs a relatively large voltage Vdef, and therefore, the driving current Id output by the V/I conversion circuit 26 is increased, and the intensity of the light beam emitted by the laser diode LD is increased. If the intensity of the laser beam is greater than an intensity corresponding to the reference voltage Vref, the monitor voltage Vmon is greater than the reference voltage Vref. Then, the output voltage Vdef of the differential amplifier 25 is lowered. Thus, the driving current Id output by the V/I conversion circuit 26 is lowered, and the intensity of the light beam emitted by the laser diode LD is lowered.

With the above-described APC system, the intensity of the laser beam emitted by the laser diode LD is controlled to be an intensity corresponding to the reference voltage Vref. If the data voltage Vdata is changed as the data signal Sdata is changed, the reference voltage Vref is changed, and then the intensity of the laser beam output by the laser diode LD is changed accordingly. That is, the intensity of the laser beam emitted by the laser diode LD is modulated in accordance with the data signal Sdata. Thus, black density of an image formed on a photoconductive surface (not shown) is adjusted in accordance with the data signal Sdata.

In the above-described modulating device employing the APC system, when the data signal Sdata is changed and the reference voltage Vref is changed, the intensity of the laser beam emitted by the laser diode LD should be quickly changed responsive to the change of the reference voltage Vref. Therefore, the D/A conversion circuit 21, the I/V conversion circuit 27, the differential amplifier 25 and the V/I conversion circuit 26 should be constituted as quick-response (high-speed) circuits. However, in order to constitute a quick-response circuit, electronic elements and semiconductor elements should be quick-responsive ones, which increases a manufacturing cost of each circuit. Further, even if the each circuit is constituted as a quick-responsive circuit, due to accumulated affects of potential delays of the I/V conversion circuit 27, differential amplifier 25 and V/I conversion circuit 26, it is still difficult to lower the delays sufficiently. Thus, it has been difficult to constitute a quick-response APC type modulating device.

SUMMARY OF THE INVENTION

It is therefore an object of the invention to provide an improved laser modulating device having a quick-response so that the delay within an APC loop is relatively small.

For the above object, according to the present invention, there is provided a laser modulating device for driving a laser diode to emit a modulated laser beam in accordance with input data. The laser modulating device is provided with a monitoring system that detects output power of the laser diode and outputs a detection signal corresponding to the output power, a minimum output level setting system that outputs a minimum level signal defining a minimum output power of the laser diode, a modulating signal generating system that generates a modulating signal representing modulation information of the output power of the laser diode corresponding to input data, a first adder that outputs a sum of the minimum level signal and the modulating signal as a reference signal, a comparing system that compares the reference signal and the detection signal and outputs the driving signal so as to make the detection signal coincide with the reference signal, and a circuit that supplies the modulating signal to the laser diode, the modulating signal being added to the driving signal.

With this configuration, the modulating signal is directly supplied to the laser diode at a first stage, the output power is adjust quickly. Further, the APC functions after the output power was adjusted, and therefore, the output power is stabilized. Furthermore, regardless of the amplitude of the modulating signal, the driving signal has substantially the same amplitude, which also stabilizes the output power of the laser diode.

Optionally, the modulating signal generating system may include a maximum output level setting system that outputs a maximum level voltage required for setting a maximum output power of the laser diode, and a modulating voltage generating circuit that generates, in accordance with the maximum level voltage, a data voltage whose level corresponds to a data value of the data signal.

Further, the modulating voltage generating circuit includes a D/A conversion circuit that outputs one of a plurality of levels of voltage values in accordance with a data value of the data signal.

Still optionally, the monitor system may include a photo diode that outputs an electrical current corresponding to a received light beam, and an I/V conversion circuit that converts the electrical current generated by the photo diode into a monitor voltage, Further, the reference signal is a reference voltage, and the comparing system includes a differential amplifier that compares the reference voltage with the monitor voltage, and outputs a voltage corresponding to the difference between the reference voltage and the monitor voltage. Further, and a first V/I conversion circuit that generates a first driving current based on the voltage output by the differential amplifier, the first driving current being supplied to the laser diode.

In this case, the circuit may include a V/I conversion circuit that generate a second driving current based on the data voltage, the second driving current being added to the first driving current.

Preferably, the D/A conversion circuit and the second V/I conversion circuit are high-speed circuits, respectively.

Still optionally, the circuit may include a gain adjustment circuit that adjusts the gain of the data voltage and outputs the modulating voltage, and a second adder that adds the modulating voltage output by the gain adjustment circuit to the voltage output by the differential amplifier, the added voltage being input to the first V/I conversion circuit.

In this case, it is preferable that the D/A conversion circuit, the gain adjustment circuit and the first V/I conversion circuit are high-speed circuits, respectively.

In a particular case, there is provided a laser modulating device for driving a laser diode to emit a modulated laser beam in accordance with input data, which is provided with a monitoring system that detects output power of the laser diode and outputs a detection voltage signal corresponding to the output power, a minimum output level setting system that outputs a minimum level voltage signal defining a minimum output power of the laser diode, a modulating voltage signal generating system that generates a modulating voltage signal representing modulation information of the output power of the laser diode corresponding to the input data, a first adder that outputs a sum of the minimum level voltage signal and the modulating voltage signal as a reference voltage signal, a comparing system that compares the reference voltage signal and the detection voltage signal, and outputs a driving voltage signal for the laser diode so as to make the detection voltage signal coincide with the reference voltage signal, a first voltage to current converting system that converts the driving voltage signal to a first driving current, the first driving current being supplied to the laser diode, a second voltage to current converting system, and a circuit that directly supplies the modulating voltage signal from the modulating voltage signal generating system to the second voltage to current converting system, the second voltage to current converting system converting the modulating voltage signal into a second driving signal, the second driving signal being supplied to the laser diode.

In another particular case, there is provided a laser modulating device for driving a laser diode to emit a modulated laser beam in accordance with input data, which is provided with a monitoring system that detects output power of the laser diode and outputs a detection voltage signal corresponding to the output power, a minimum output level setting system that outputs a minimum level voltage signal defining a minimum output power of the laser diode, a modulating voltage signal generating system that generates a modulating voltage signal representing modulation information of the output power of the laser diode corresponding to the input data, a first adder that outputs a sum of the minimum level voltage signal and the modulating voltage signal as a reference voltage signal, a comparing system that compares the reference voltage signal and the detection voltage signal, and outputs a differential voltage signal representing a difference between the reference voltage signal and the detection voltage signal, a gain adjustment system that converts the modulating voltage signal into a modified modulating voltage signal in accordance with a differential efficiency of the laser diode, a second adder that outputs a sum of the differential voltage signal and the modified modulating voltage signal and outputs a driving voltage signal, and a voltage-to-current converting system that converts the driving voltage signal to a driving current, the first driving current being supplied to said laser diode.

BRIEF DESCRIPTION OF THE ACCOMPANYING DRAWINGS

FIG. 1 schematically shows a top view of a laser scanning device employing a modulating device;

DESCRIPTION OF THE EMBODIMENTS

Hereinafter, the embodiments of the present invention will be described with reference to the accompanying drawings.

Figure 1:
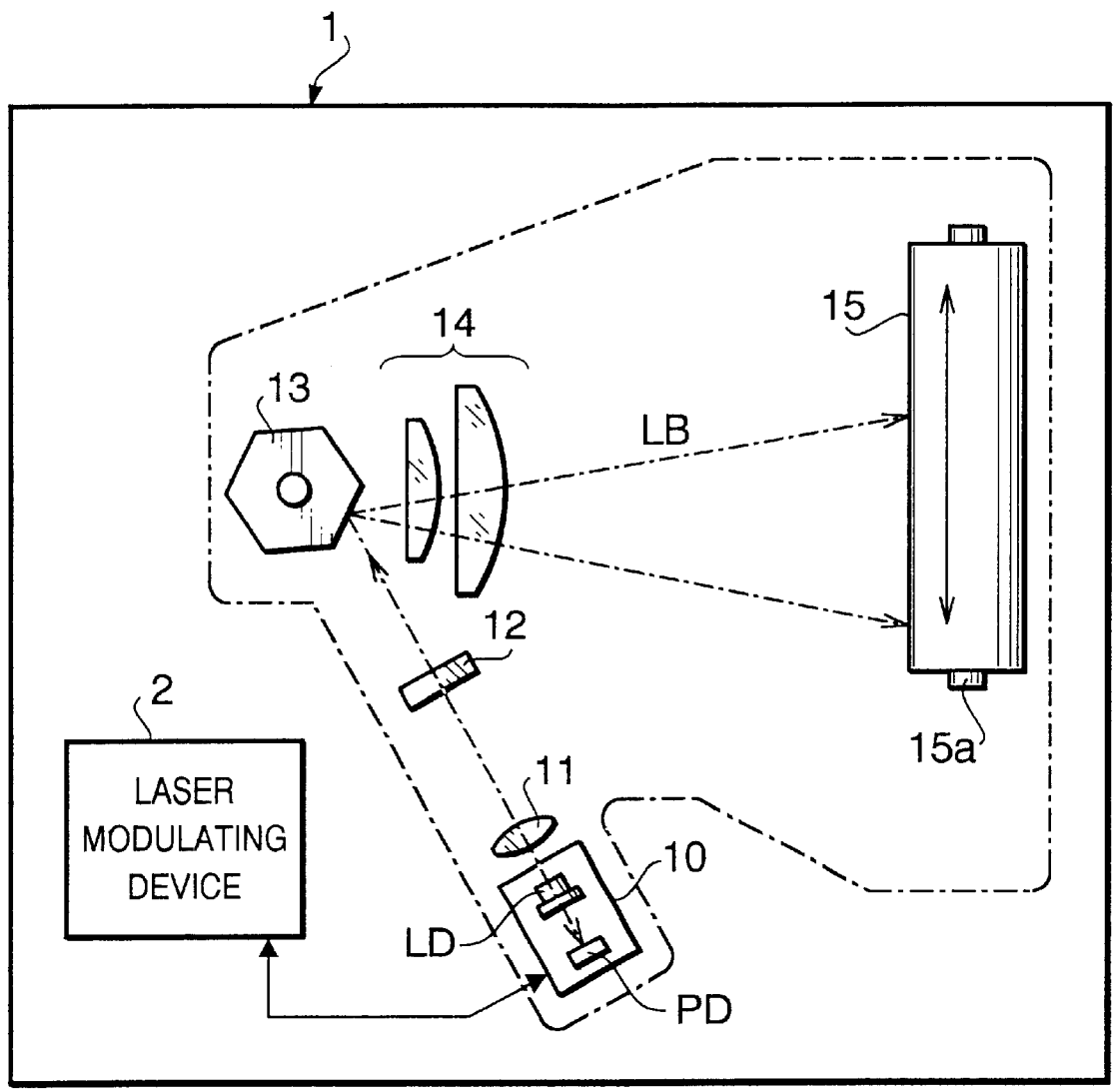

FIG. 1 shows a structure of a laser scanning device 1 to which modulating devices according to the present invention are applicable.

The laser scanning device 1 is provided with a laser emitting element 10 including a unitary formed laser diode LD and a photo diode PD for monitoring the intensity of a laser beam backwardly emitted by the laser diode LD. The laser beam emitted by the laser diode LD is collimated by a collimating lens 11 into a parallel light beam LB. The laser beam LB passes through a cylindrical lens 12 and impinges on a polygonal mirror 13, which is rotated at a predetermined high speed. The laser beam LB is deflected by reflective side surfaces of the rotating polygonal mirror 13 to repeatedly scan within a predetermined angular range. The scanning beam LB passes through the fθ lens 14, and is converged on a photoconductive surface of a photoconductive drum 15 to form a beam spot, which moves on the photoconductive surface of the photoconductive drum 15 at a constant speed. It should be noted that the photoconductive drum 15 is arranged such that the beam spot formed on the photoconductive surface moves in a direction parallel to a rotation shaft 15a thereof. Hereinafter, the direction in which the beam spot moves is referred to as a main scanning direction. The photoconductive drum 15 is rotated about the shaft 15a (i.e., an auxiliary scanning is performed) while the beam spot moves in the main scanning direction. The laser scanning device 1 is further provided with a laser modulating device 2 which is connected with the laser diode LD and the photo diode PD. When an image data is input to the laser scanning device 1 from an not shown external apparatus, the modulating circuit 2 controls the output power of the laser diode LD (i.e., the intensity of the laser beam emitted by the laser diode LD) based on the image data. That is, the APC (Auto Power Control) is applied so that the output power of the laser diode LD corresponds to the image data when the laser diode LD is driven to emit the laser beam. By modulating the laser beam LB when the above-described main scanning and auxiliary scanning are performed, a two-dimensional pattern (i.e., an electrostatic latent image) is drawn on the photoconductive surface of the photoconductive drum 15.

Figure 2:
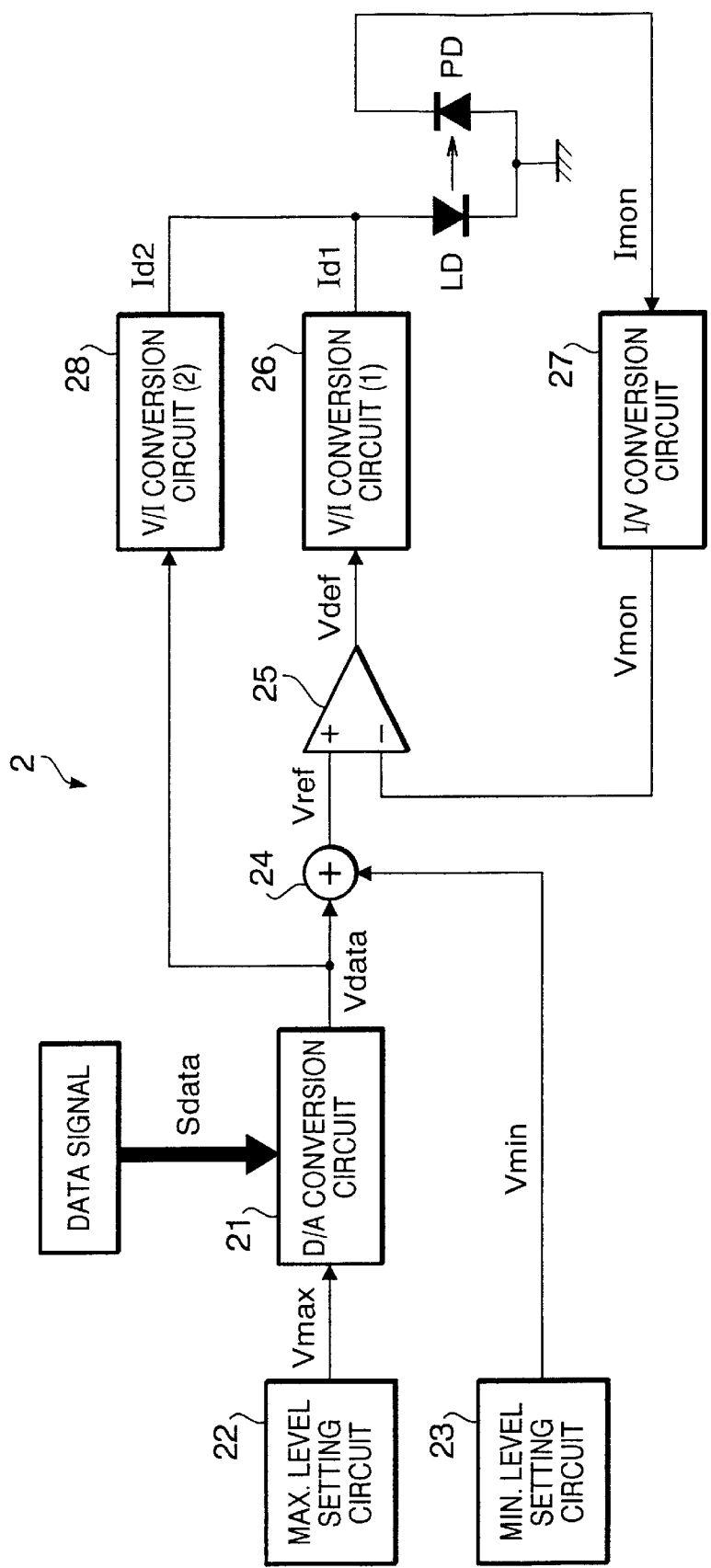
FIG. 2 is a block diagram of a modulating device according to a first embodiment of the invention.
Figure 6:
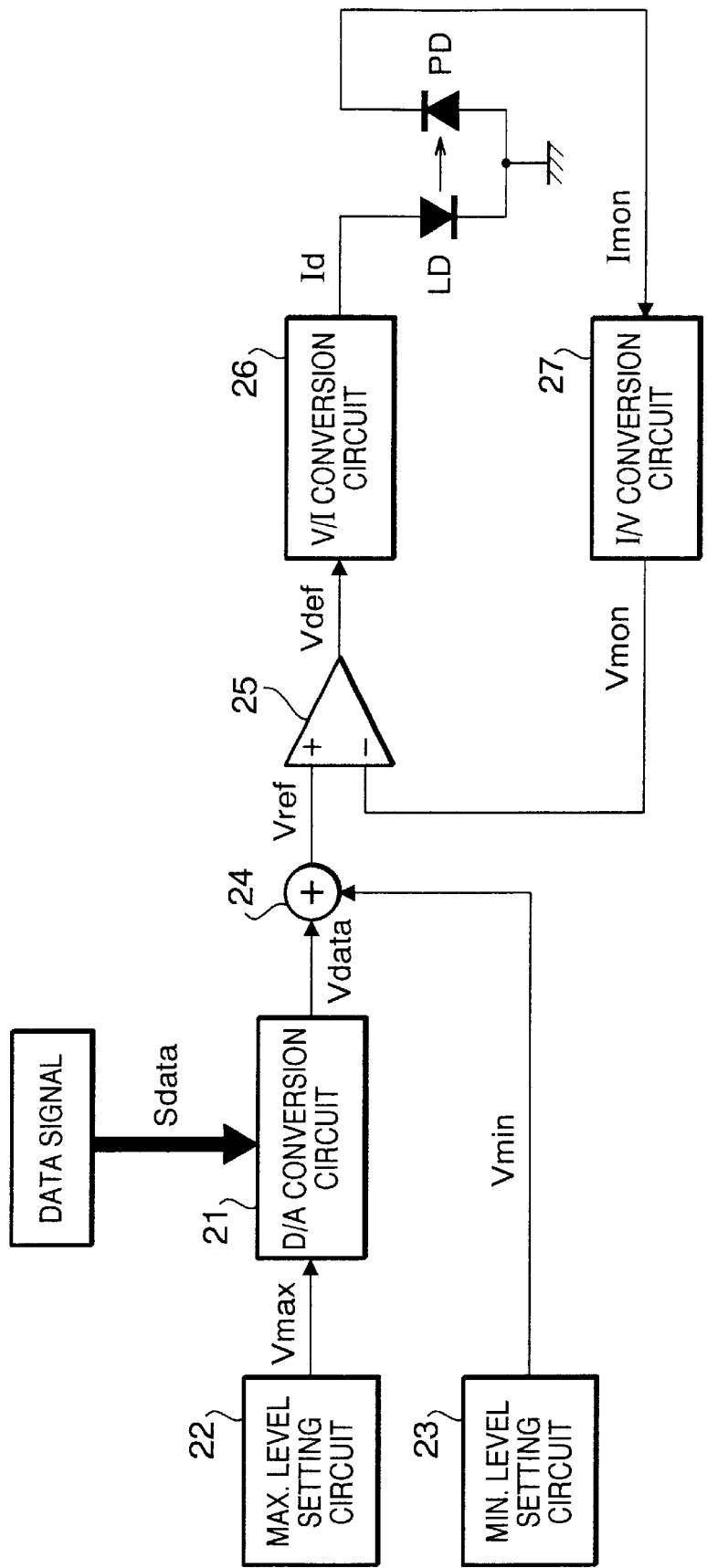
FIG. 6 is a block diagram of a conventional modulating device.

FIG. 2 is a block diagram of a modulating circuit 2 according to a first embodiment of the present invention. The structure of the modulating circuit 2 is similar to the conventional modulating circuit shown in FIG. 6 except that two V/I (voltage to current) conversion circuits, i.e., first V/I conversion circuit 26 and second V/I conversion circuit 28 are provided. It should be noted that, according to the first embodiment, it is not necessary that all the circuits are high-speed circuits as will be explained later.

The D/A conversion circuit 21 outputs the data voltage Vdata in accordance with the maximum level voltage Vmax, which corresponds to the maximum output power Pmax of the laser diode LD, output by a maximum level setting circuit 22, and the data signal Sdata representing the black density distribution of an image to be formed. The minimum level voltage Vmin is output by the minimum level setting circuit 23 based on the minimum output power Pmin of the laser diode LD. The data minimum level voltage Vmin and the data voltage Vdata are added by the adder 24, which outputs a reference voltage Vref. The reference voltage Vref is input to one of the input ports (non-inverted input port) of the differential amplifier 25. The differential amplifier 25 outputs the voltage Vdef, which is converted into the electrical current Id1 by the first V/I conversion circuit 26. The electrical current Id1 is supplied to the laser diode LD as a first driving current Id1. When the first driving current Id1 is supplied, the laser diode LD emits a laser beam, part of which (e.g., backwardly emitted beam) is received by the photo diode PD. An electrical current Imon is generated by the photo diode PD corresponding to the intensity of the received laser beam. The electrical current Imon is converted, by the I/V conversion circuit 27, into the monitor voltage Vmon, which is input to another input port (i.e., the inverted input port) of the differential amplifier 25. Then, the differential amplifier 25 outputs the voltage Vdef, which corresponds to the difference between the reference voltage Vref and the monitor voltage Vmon. The voltage Vdef is converted, by the V/I conversion circuit 26, into the first driving current Id1. Thus, an APC loop is constituted.

In addition to the above configuration, in the first embodiment, a second V/I conversion circuit 28, which converts the output of the D/A conversion circuit 21 into a second driving current Id2, is provided. A sum of the first and second driving currents Id1 and Id2 is supplied to the laser diode LD.

The maximum level setting circuit 22 sets the maximum output level of the D/A conversion circuit 21 by inputting the voltage Vmax. Then, based on the data signal Sdata transmitted as black density data of an image, the D/A conversion circuit 21 outputs the data voltage Vdata that corresponds to the data signal Sdata. This will be described in detail.

For explanation, it is assumed that the data is a 10-bit signal, the digital value of the data signal Sdata corresponding to the maximum black density is 1111111111, and the digital value of the data signal Sdata corresponding to the minimum black density level is 0000000000. In this case, in the D/A conversion circuit 21, a voltage range of 0 through Vmax is divided into 1024 (i.e., $2^{10}$). Thus, the D/A conversion circuit 21 outputs a voltage (i.e., Vdata) which is one of 1024 steps of the voltage range of 0 through Vmax corresponding to the input data signal Sdata. As shown in FIG. 2, at the adder 24, the output voltage Vdata of the D/A conversion circuit 21 and the minimum level voltage Vmin are added. Therefore, the reference voltage Vref output by the adder 24 is one of 1024 steps of the voltage range of Vmin through (Vmax+Vmin). In other words, when the black density of an image is zero (i.e., the image is white), the reference voltage Vref equals to Vmin. When the black density is a certain value, the reference voltage Vref is represented by Vmin+Vdata. In particular, when the black density is maximum, the reference voltage Vref equals to Vmin+Vmax. The reference voltage Vref is applied to the non-inverting input port of the differential amplifier 25.

The photo diode PD shown in FIG. 2 receives a laser beam emitted by the laser diode LD, and generates the monitor current Imon, which is converted to the monitor voltage by the I/V conversion circuit 27. The monitor voltage Vmon is applied to the other input port (i.e., the inverted input port) of the differential amplifier 25.

The differential amplifier 25 amplifies the difference between the reference voltage Vref and the monitor voltage Vmon, and outputs the amplified voltage Vdef. The voltage Vdef is converted, by the V/I conversion circuit 26, into the first driving current Id1, which is supplied to the laser diode LD.

The data voltage Vdata output by the D/A conversion circuit 21 is converted in the second driving current Id2 by the V/I conversion circuit 28. The second driving current Id2 is added to the first driving current Id1, and supplied to the laser diode LD. It is preferable that the first V/I conversion circuit 26 and the second V/I conversion circuit 28 have substantially the same voltage/current characteristics. It is of course possible the voltage/current characteristics of the first and second V/I conversion circuits 26 and 28 are different. In either case, according to the embodiment, the second V/I conversion circuit 28 is configured to have a higher response that the first V/I conversion circuit 26, and is capable of converting a voltage to a current at a higher speed than the first V/I conversion circuit 26. It should be noted that the second V/I conversion circuit 28 should be configured to be a high-speed circuit in order to satisfy a required high-speed response for the modulating circuit 2 of the laser scanning device 1.

Hereinafter, the operation of the modulating device 2 according to the first embodiment will be described.

Firstly, it is assumed that the value of the data signal Sdata is 0000000000. In this case, the data voltage Vdata equals to zero volt. Accordingly, the reference voltage Vref is equal to the minimum voltage Vmin. Then, the voltage Vdef output by the differential amplifier 25 is determined based on a difference between the minimum voltage Vmin and the monitor voltage Vmon. As a result, the first driving current Id1 corresponds to the current reference voltage Vref (i.e., the minimum voltage Vmin), and the laser diode LD is driven with this current Id1. The laser beam emitted by the laser diode LD is received by the photo diode PD, and the monitor current Imon is generated, which is converted into the monitor voltage Vmon. The monitor voltage Vmon is applied to the differential amplifier 25, which compares the monitor voltage with the reference voltage Vref. The differential amplifier 25 outputs the voltage Vdef corresponding to the difference between the reference voltage Vref and the monitor voltage Vmon. The APC is performed in this way, and the power of the laser beam emitted by the laser diode LD is finally adjusted to the minimum power Pmin.

Next, it is assumed that the value of the data signal Sdata has been changed to a value representing a certain intermediate black density with respect to the above condition. Then, the data voltage Vdata corresponding to the data signal Sdata is output from the D/A conversion circuit 21. The adder 24 outputs a sum Vdata+Vmin as the reference voltage Vref. At the same time, the data voltage Vdata is input to the second V/I conversion circuit 28, which outputs the second driving current Id2 corresponding to the data signal Sdata. As described above, the second V/I conversion circuit 28 is configured as a high-speed circuit, and therefore, the second driving current Id2 reflects the change of the data signal Sdata immediately. The second driving current Id2 corresponding to the data signal Sdata is added to the first driving current Id1. Therefore, the first and second driving currents Id1 and Id2 are supplied to the laser diode LD and the power of the laser beam is changed (increased) quickly.

Since the power of the laser beam increases, the monitor current Imon increases, and the monitor voltage Vmon increases. The reference voltage Vref at this stage is Vdata+Vmin. Thus, at the differential amplifier 25, a voltage Vdata+Vmin and the monitor voltage Vmon are compared. It should be noted that the monitor voltage Vmon corresponds to the power of the laser beam when the sum of the driving currents Id1+Id2 is supplied to the laser diode LD. Therefore, in the following sequence, the APC is performed so that the power of the laser beam corresponds to the data signal Sdata. In the APC process, the voltage Vref remains substantially unchanged, and therefore, the first driving current Id1 remains substantially constant, i.e., the first driving current Id1 corresponds to the minimum level voltage Vmin regardless of the change of the data voltage Vdata.

In summary, the first driving current Id1 corresponds to the minimum voltage Vmin regardless of the value of the data signal Sdata. When the data signal Sdata and therefore the data voltage are changed, the second driving current Id2, which has a direct correspondence with the data voltage Vdata, is supplied to the laser diode LD together with the first driving current Id1, and the power of the laser beam is adjusted to correspond to the data signal Sdata immediately. Then, in response to the change of the power of the laser beam, the monitor voltage Vmon is changed, and the APC process is performed. Since the reference voltage Vref is Vmin+Vdata, the APC process is performed so that the monitor voltage Vmon coincides with the reference voltage Vref (which equals to Vmin+Vdata).

Since the second V/I conversion circuit 28 outputs the second driving current Id2 corresponding to the data voltage Vdata, if the second V/I conversion circuit 28 is configured to have a quick-response, it is possible to increase the response of the laser diode LD. Further, the APC follows the quick change of the power of the laser beam, the power of the laser beam can be maintained stably to the level corresponding to the data voltage Vdata.

Figure 3:
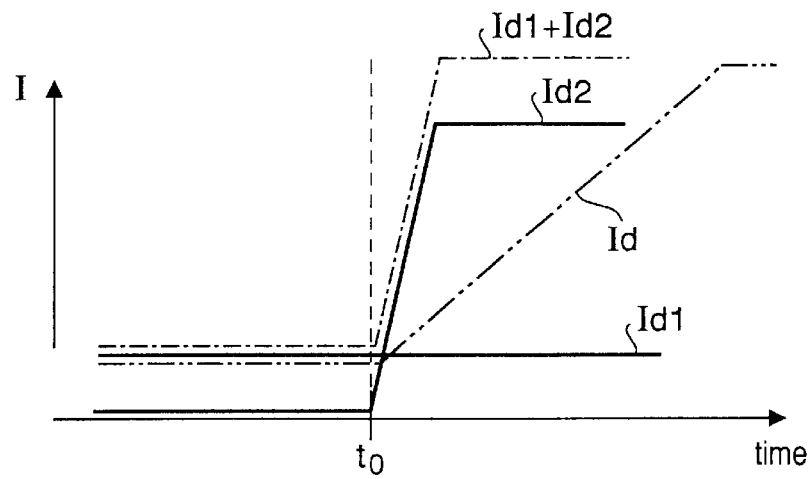
FIG. 3 shows a output/current characteristic of a laser diode.

FIG. 3 is a timing chart showing the change of the driving currents. As shown in FIG. 3, when the data voltage Vdata is changed at time t0, the second driving current Id2 changes quickly, and therefore the sum of the first and second driving currents Id1+Id2 also changes quickly. In comparison to the change of the second driving current Id2, a current Id, which represent the output of the V/I conversional circuit 26 of the conventional modulating device shown in FIG. 6, changes relatively slowly. It should be noted that the characteristics of the conventional modulating device shown in FIG. 3 is obtained when the differential amplifier 25, the I/V conversion circuit 27 and the first V/I conversion circuit 26 are the same as those used in the first embodiment. As known from FIG. 3, according to the first embodiment, for the circuits constituting the APC loop, a quick response is not required, and therefore, the I/V conversion circuit 27, the differential amplifier 25 and the first V/I conversion circuit 26 are not necessarily be configured as circuits using quick-response elements, which are relatively expensive. Accordingly, a manufacturing cost of the circuits can be lowered.

According to the first embodiment, in order to achieve the quick response of the modulating device 2, only the D/A conversion circuit 21 and the second V/I conversion circuit 28 are to be made as quick-response circuits. Accordingly,21 the manufacturing cost of the modulating device 2 can also be lowered.

An example of the high-speed D/A conversion circuit 21 is AD9732, which is a 10-bit D/A converter manufactured by Analog Devices, Inc. Another example of the high-speed D/A conversion circuit 21 is MAX5140, which is an 8-bit D/A converter manufactured by Maxim Integrated Products, Inc.

Further, the response of the modulating device 2 substantially depends on the response of the second V/I conversion circuit 26, even if the delay of each of the circuits constituting the APC loop (i.e., the I/V conversion circuit 27, the differential amplifier 25 and the first V/I conversion circuit 26) are accumulated and the APC loop has a relatively large delay, the response of the modulating device 2 is not affected.

Figure 4:
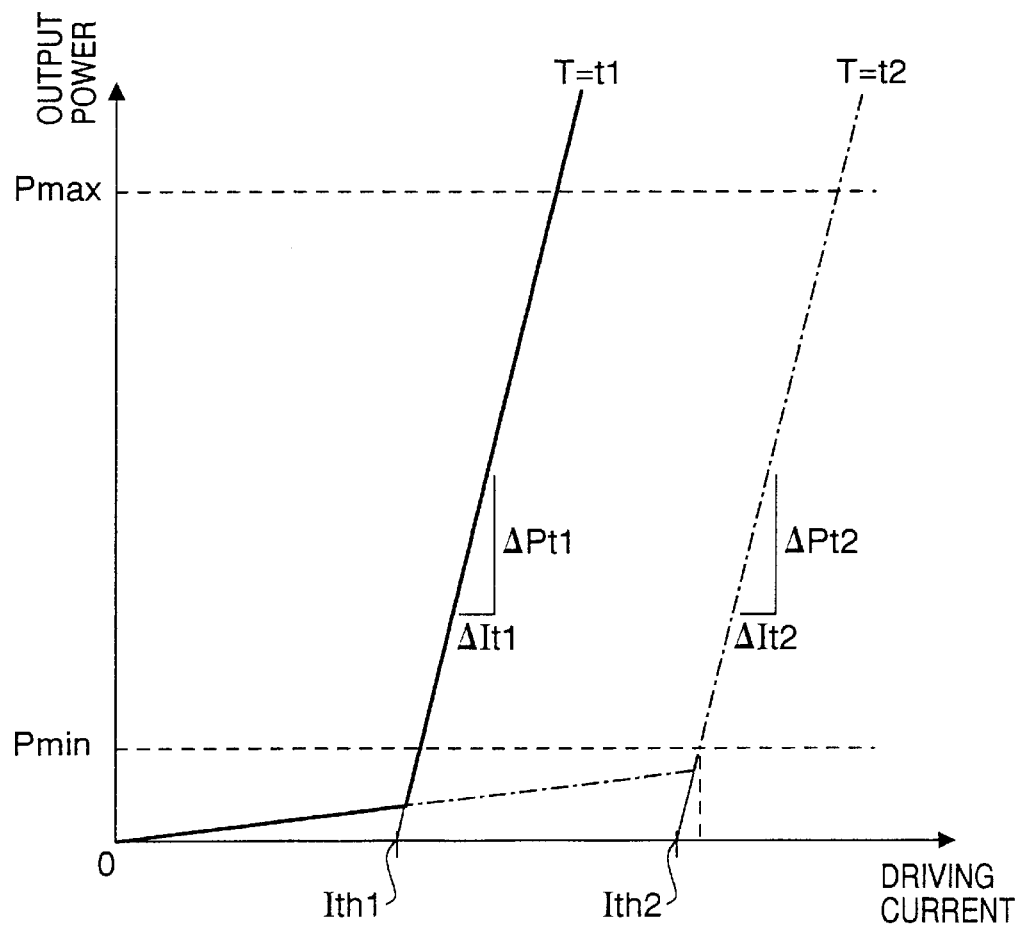
FIG. 4 shows timing of rising-edges of a first driving current and a second driving current.

FIG. 4 shows a power/current characteristics and temperature characteristic of the laser diode LD. Solid line represents a characteristic when the temperature T equals to t1, and one-dotted line represents a characteristic when the temperature T equals to t2, which is greater than t1. As shown in FIG. 4, when the temperature changes, the power/current characteristic of the laser diode LD changes. In particular, the threshold current Ith of the laser diode LD changes exponentially. However, a differential efficiency $\eta$ remains substantially the same regardless of the temperature. It should be noted that the differential efficiency $\eta$ is defined such that $$\eta = \Delta P / \Delta I$$

where, $\Delta P$ is a change of power, and $\Delta I$ is a change of driving current. Further, within a guaranteed output range, the output power of the laser diode LD linearly changes with respect to the driving current, and the differential efficiency η is constant. Therefore, when the temperature changes from t1 to t2, the threshold current changes from Ith1 to Ith2. However, the differential efficiency η remains constant.

Therefore, it is preferable, in order to guarantee the operation of the modulating device 2 within a temperature range from t1 to t2, that the minimum output power Pmin is greater than the output power at the threshold current Ith2 when the temperature is t2. With this configuration, the change of the output power of the laser diode LD and the change of the second driving current Id2 has substantially a linear relationship, and therefore, the output power can be controlled stably using the modulating device according to the first embodiment.

Figure 5:
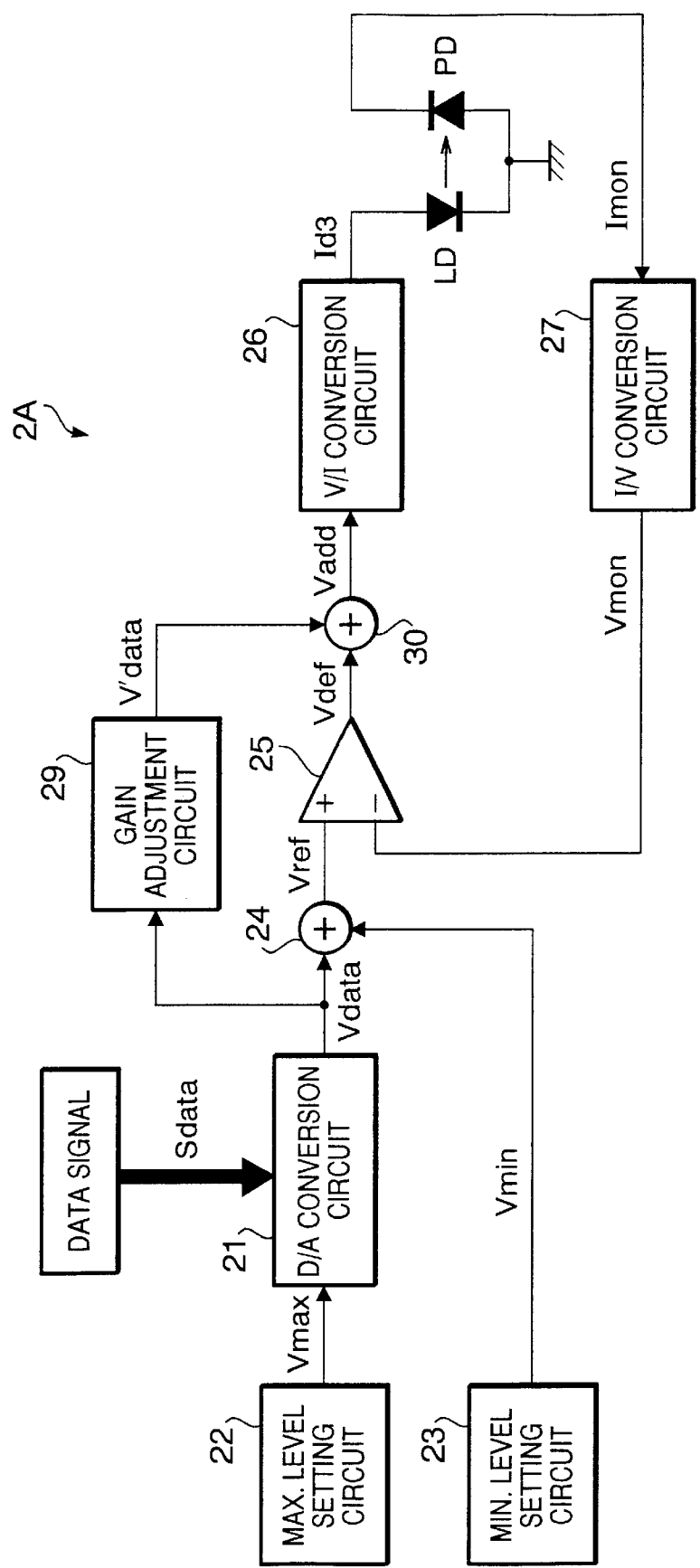
FIG. 5 is a block diagram of a modulating device according to a second embodiment of the invention.

FIG. 5 shows a modulating device 2A according to a second embodiment of the present invention.

In FIG. 5, elements similar to those in the first elements are given the same reference numerals, and description thereof will be omitted.

In the second embodiment, the second V/I conversion circuit 28 provided in the first embodiment is omitted, and a gain adjustment circuit 29 and a second adder 30 are added. As shown in FIG. 5, the data voltage Vdata output by the D/A conversion circuit 21 is applied to the gain adjustment circuit 29. The gain adjustment circuit 29 adjusts the amplitude of the input voltage and outputs an adjusted data voltage V'data, which is input to the adder 30 provided between the differential amplifier 25 and the V/I conversion circuit 26. It should be noted that the differential efficiency of a laser diode is not constant among a plurality of laser diodes. Therefore, if the data voltage Vdata is simply added to the reference voltage Vref, and the added voltage is converted into the driving current as it is by the V/I conversion circuit 26, the output power of the laser diode LD may not be adjusted to a value corresponding to the data signal Sdata. The gain adjustment circuit 29 is inserted for compensating the individual differences of differential efficiency among a plurality of laser diodes. With this configuration, the same D/A conversion circuit 21 and the same V/I conversion circuit 26 can be used for the laser diodes having individual differences. The gain of the gain adjustment circuit 29 is therefore adjustable to an arbitrary value including gain 1 (i.e., 0 dB), the gain being determined depending on the differential efficiency of the laser diode LD employed in the laser modulating device 2A.

In the second embodiment, the data voltage Vdata output by the D/A conversion circuit 21 is adjusted by the gain adjustment circuit 29, which outputs the adjusted data voltage V'data. The second adder 30 adds the voltage Vdef and the adjusted data voltage V'data, and outputs the added voltage Vadd to the V/I conversion circuit 26. With this configuration, the driving current Id3 output by the V/I conversion circuit 26 corresponds to the added voltage Vmin+V'data. Then, the output power of the laser diode LD is controlled to the power corresponding to the data signal Sdata as the driving current Id3 generated as above is supplied to the laser diode LD. Then, the photo diode PD outputs the monitor current Imon corresponding to the output power of the laser diode LD. The monitor current Imon is converted into the monitor voltage Vmon by the I/V conversion circuit 27. The differential amplifier 25 compares the monitor voltage Vmon and the reference voltage Vref, and output the voltage Vdef. The second adder 30 outputs the sum (i.e., Vadd) of the voltage Vdef and the adjusted data voltage V'data. The V/I conversion circuit 26 converts the voltage Vadd into the driving current Id3, which is supplied to the laser diode LD. Thus, the APC process is performed and the output power of the laser diode LD is adjusted to the power corresponding to the data voltage Vdata.

According to the second embodiment, therefore, if the D/A conversion circuit 21, the gain adjustment circuit 29 and the first V/I conversion circuit 26 are configured to be high-speed circuits, respectively, the quick response of the modulating device 2A can be achieved. Therefore, the I/V conversion circuit 27 and the differential amplifier 25 are not necessarily be configured to be high-speed circuits. Accordingly, the manufacturing cost of the modulating device 2A can be lowered without lowering the operation thereof. Further, similarly to the first embodiment, even if there is considerable delay in the APC loop, the response of the modulating device 2A will not substantially be lowered.

In the above embodiments, the data signal Sdata is converted into the one of a plurality of levels. However, the invention is not limited to such a configuration, and the data voltage Vdata may be directly changed as an analog value in accordance with a desired output power of the laser diode.

The present disclosure relates to the subject matter contained in Japanese Patent Application No. HEI 11-272736, filed on Sep. 27, 1999, which is expressly incorporated herein by reference in its entirety.

What is claimed is:

1. A laser modulating device for driving a laser diode to emit a modulated laser beam in accordance with input data, comprising:

a monitoring system that detects output power of the laser diode and outputs a detection signal corresponding to the output power;

a minimum output level setting system that outputs a minimum level signal defining a minimum output power of said laser diode;

a modulating signal generating system that generates a modulating signal representing modulation information of the output power of said laser diode corresponding to input data;

a first adder that outputs a sum of the minimum level signal and the modulating signal as a reference signal;

a comparing system that compares the reference signal and the detection signal and outputs the driving signal so as to make the detection signal coincide with the reference signal; and a circuit that supplies the modulating signal to said laser diode, the modulating signal being added to the driving signal.

2. The laser modulating device according to claim 1, wherein said modulating signal generating system includes:

a maximum output level setting system that outputs a maximum level voltage required for setting a maximum output power of said laser diode; and a modulating voltage generating circuit that generates, in accordance with the maximum level voltage, a data voltage whose level corresponds to a data value of the data signal.

3. The laser modulating device according to claim 2, wherein said modulating voltage generating circuit includes a D/A conversion circuit that outputs one of a plurality of levels of voltage values in accordance with a data value of the data signal.

4. The laser modulating device according to claim 1, wherein said monitor system includes a photo diode that outputs an electrical current corresponding to a received light beam, and an I/V conversion circuit that converts the electrical current generated by the photo diode into a monitor voltage;

wherein the reference signal is a reference voltage;

wherein said comparing system includes a differential amplifier that compares the reference voltage with the monitor voltage, and outputs a voltage corresponding to the difference between the reference voltage and the monitor voltage; and a first V/I conversion circuit that generates a first driving current based on the voltage output by said differential amplifier, the first driving current being supplied to said laser diode.

5. The laser modulating device according to claim 4, wherein said circuit includes a V/I conversion circuit that generate a second driving current based on said data voltage, the second driving current being added to the first driving current.

6. The laser modulating device according to claim 5, wherein said D/A conversion circuit and said second V/I conversion circuit being high-speed circuits, respectively.

7. The laser modulating device according to claim 4, wherein said circuit includes a gain adjustment circuit that adjusts the gain of the data voltage and outputs the modulating voltage, and a second adder that adds the modulating voltage output by said gain adjustment circuit to the voltage output by said differential amplifier, the added voltage being input to said first V/I conversion circuit.

8. The laser modulating device according to claim 7, wherein said D/A conversion circuit, said gain adjustment circuit and said first V/I conversion circuit are high-speed circuits, respectively.

9. A laser modulating device for driving a laser diode to emit a modulated laser beam in accordance with input data, comprising:

a monitoring system that detects output power of the laser diode and outputs a detection voltage signal corresponding to the output power;

a minimum output level setting system that outputs a minimum level voltage signal defining a minimum output power of said laser diode;

a modulating voltage signal generating system that generates a modulating voltage signal representing modulation information of the output power of said laser diode corresponding to the input data;

a first adder that outputs a sum of the minimum level voltage signal and the modulating voltage signal as a reference voltage signal;

a comparing system that compares the reference voltage signal and the detection voltage signal, and outputs a driving voltage signal for the laser diode so as to make the detection voltage signal coincide with the reference voltage signal;

a first voltage-to-current converting system that converts the driving voltage signal to a first driving current, said first driving current being supplied to said laser diode;

a second voltage-to-current converting system; and a circuit that directly supplies the modulating voltage signal from said modulating voltage signal generating system to said second voltage to current converting system, said second voltage to current converting system converting the modulating voltage signal into a second driving signal, said second driving signal being supplied to said laser diode.

10. A laser modulating device for driving a laser diode to emit a modulated laser beam in accordance with input data, comprising:

a monitoring system that detects output power of the laser diode and outputs a detection voltage signal corresponding to the output power;

a minimum output level setting system that outputs a minimum level voltage signal defining a minimum output power of said laser diode;

a modulating voltage signal generating system that generates a modulating voltage signal representing modulation information of the output power of said laser diode corresponding to the input data;

a first adder that outputs a sum of the minimum level voltage signal and the modulating voltage signal as a reference voltage signal;

a comparing system that compares the reference voltage signal and the detection voltage signal, and outputs a differential voltage signal representing a difference between the reference voltage signal and the detection voltage signal;

a gain adjustment system that converts the modulating voltage signal into a modified modulating voltage signal in accordance with a differential efficiency of said laser diode;

a second adder that outputs a sum of the differential voltage signal and the modified modulating voltage signal and outputs a driving voltage signal; and a voltage-to-current converting system that converts the driving voltage signal to a driving current, said first driving current being supplied to said laser diode.

\* \* \* \* \*